(12) United States Patent
Nishii et al.

(10) Patent No.: US 6,466,151 B2
(45) Date of Patent: Oct. 15, 2002

(54) A/D CONVERTER

(75) Inventors: Katsuyoshi Nishii, Okazaki; Takamoto Watanabe, Nagoya, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/971,688

(22) Filed: Oct. 9, 2001

(65) Prior Publication Data

US 2002/0060638 A1 May 23, 2002

(30) Foreign Application Priority Data

Oct. 11, 2000 (JP) ........................................ 2000-310652

(51) Int. Cl.⁷ ................................................. H03M 1/60
(52) U.S. Cl. ....................................... 341/155; 341/157
(58) Field of Search ................................ 341/157, 166, 341/118

(56) References Cited

U.S. PATENT DOCUMENTS 5,396,247 A 3/1995 Watanabe et al.
5,465,076 A 11/1995 Yamauchi et al.

FOREIGN PATENT DOCUMENTS

| JP | A-49-102268 | 9/1974 |
| JP | A-61-164334 | 7/1986 |
| JP | A-5-259907 | 10/1993 |
| JP | A-11-44585 | 2/1999 |

*Primary Examiner*—Brian Young
(74) *Attorney, Agent, or Firm*—Law Offices of David G. Posz

(57) ABSTRACT

An analog input voltage signal to be A/D-converted is supplied to a ring gate delay circuit including inverting circuits connected in series in a ring as a supply voltage thereto. The interval for which a pulse circulates the ring varies with the analog input voltage signal. The number of times circulation of the pulse and the position of the pulse for a predetermined interval are detected by a counter to provide upper bits and by a pulse position detector to provide lower bits of A/D conversion result of the analog input voltage signal, respectively. The counter and the pulse position detector are included in a coding process block which is driven by a constant voltage which is different from the analog input voltage signal to the ring gate delay circuit.

7 Claims, 13 Drawing Sheets

FIG. 2
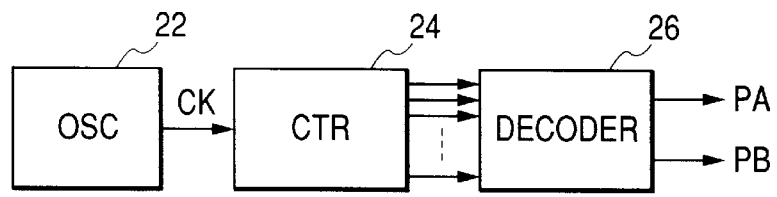
FIG. 3A  Vin  
FIG. 3B  PA  
FIG. 3C  PB  
FIG. 3D  DO1  
FIG. 4A  PA  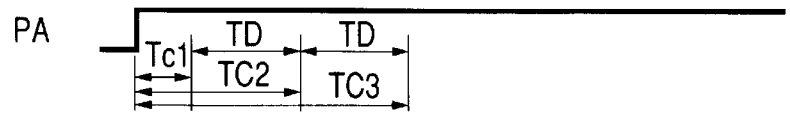
FIG. 4B  PB  
FIG. 4C  DO1  

FIG. 10A SEL
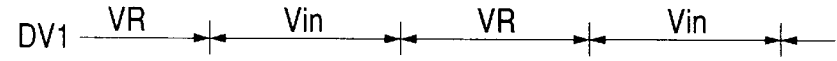
FIG. 10B DV1
FIG. 10C PA
FIG. 10D PB
FIG. 10E DO1
FIG. 10F DO2
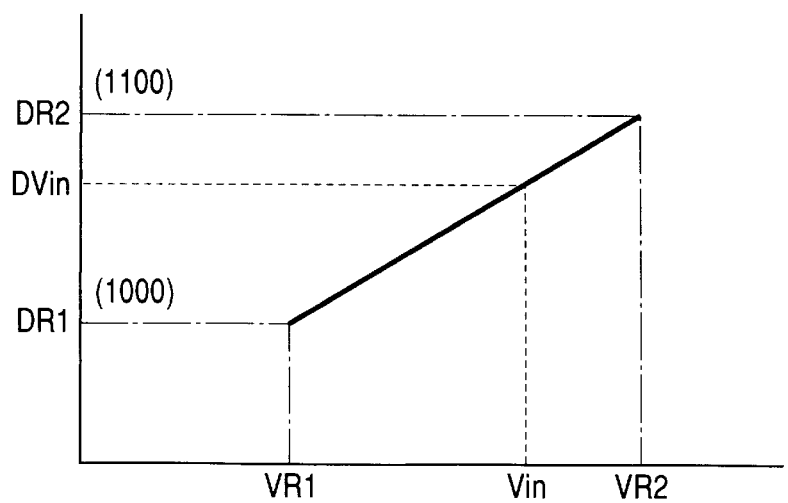
FIG. 11

A/D CONVERTER

BACKGROUND OF THE INVENTION

1. Field of the Invention

This invention relates to an A/D converter for converting a voltage of an analog input voltage signal to digital data.

2. Description of the Prior Art

An A/D converter for converting a voltage of an analog input voltage signal to digital data with a ring gate delay circuit is known. The same inventor of the present invention disclosed this prior art A/ID converter in U.S. Pat. No. 5,396,247. The ring gate delay circuit is also referred to as a pulse circulating circuit. The pulse circulating circuit includes a plurality of inverting circuits connected in series in a ring to circulate a pulse to repeatedly output the pulse. This A/D converter has no special analog circuit, so that the circuit area on a substrate of an integrated circuit can be reduced.

FIG. 16 is a block diagram of this prior art A/D converter 100. This prior art A/D converter 100 includes the pulse circulating circuit (ring gate delay circuit) 110, an input terminal 102a, a counter 112, a pulse position detection circuit 116, an encoder 118, a signal processing circuit 119 and a control circuit 104.

The pulse circulating circuit 110 includes a plurality of inverting circuits (a NAND gate and inverters) connected in series in a ring to circulate a pulse to repeatedly output the pulse in response to a pulse signal PA. The NAND gate in the pulse circulating circuit 110 has a control input to control generation of the pulse. Each inverting circuit successively shifts an edge of the pulse to the next one with delay which varies in accordance with a supply voltage thereto, that is, the analog input voltage signal Vin.

The counter 112 counts the pulses and outputs binary count data. On the other hand, the pulse position detection circuit 116 detects a position of one of the inverting circuits outputting an edge of the pulse in response to a pulse signal PB. The encoder 118 encodes the position into a binary data. The control circuit 104 generates the pulse signal PA supplied to the control input of the NAND gate in the pulse circulating circuit 110 to operate the pulse circulating circuit. After a predetermined interval from generation of the pulse signal PA, the control circuit 104 generates the pulse signal PB supplied to the pulse position detection circuit to detect the position. The outputting circuit 119 outputs A/D conversion data including the binary count data as upper bits and the binary data as lower bits.

In this prior art A/D converter, although U.S. Pat. Ser. No. 5,396,247 did not specifically describe that the analog input voltage signal was supplied to circuits other than the pulse circulating circuit (ring delay circuit) 110, the analog input voltage signal was supplied to the whole of circuits in the A/D converter 100 as its supply voltage. This affects the A/D converting operation in accuracy, particularly in linearity (non-linearity).

Due to this non-linearity, the input voltage dynamic range is limited if a sufficient accuracy is required.

FIG. 17 is a graphical drawing showing the linearity between measured voltages and the output data in the prior art A/D converter shown in FIG. 16. With the measured voltage and the output data, a linearity error NL is calculated. As a result, if the input voltage range (FS: full scale) is limited from 2.0 V to 2.2 V, NL=0.4% FS. Accordingly, a sufficient input voltage range cannot be obtained without compensation.

The linearity error NL when the analog input voltage signal Vin varies from V1 to V2 is calculated with assumption that measured values are represented by A(Vi) when Vin =Vi (i=1, 2) as follows:

$$NL = \frac{A\left[\frac{V1+V2}{2}\right] - \frac{A(V1)+A(V2)}{2}}{A(V1)+A(V2)} \qquad (1)$$

Moreover, in the prior art a/c converter 100, the analog input voltage signal Vin is used in the whole of the pulse phase difference coding circuit 2. So, if the analog input voltage signal Vin varies rapidly, a considerable interval is necessary for stabilization of the voltage of the analog input voltage signal Vin supplied to the pulse phase difference coding circuit 2.

Accordingly, if one of a plurality of image signals are successively supplied to the prior art A/D converter, the supply voltage at the phase difference coding circuit 2 would be converted in unstable conditions, so that stable A/D conversion could not be obtained.

SUMMARY OF THE INVENTION

The aim of the present invention is to provide a superior A/D converter.

According to the present invention, a first aspect of the present invention provides an A/D converter comprising: a pulse circulating circuit including a plurality of inverting circuits connected in series in a ring to generate and circulate a pulse for repeatedly outputting said pulse, one of said inverting circuits supplied with a first control signal to control generation of said pulse, each inverting circuit successively shifting an edge of said pulse to the next one of said inverting circuits with delay which varies in accordance with a supply voltage thereto; an input terminal for inputting and supplying an analog input voltage signal only to said inverting circuits as said supply voltage; a counter circuit for counting said pulse and in response to a second control signal and outputting binary count data; a pulse position detection circuit for detecting a position of one of said inverting circuits outputting an edge of said pulse and for, in response to a second control signal, encoding the position into binary encoded data; a control circuit for generating said first control signal to operate said pulse circulating circuit and after a predetermined interval from generation of said first control signal, generating said second control signal to detect said position; and an outputting circuit for outputting A/D conversion data including said binary count data as upper bits and said binary encoded data as lower bits, wherein each of said counter, said pulse position detection circuit, said control circuit, and said outputting circuit except said pulse circulating circuit, is supplied with a constant supply voltage.

According to the present invention, a second aspect of the present invention provides an A/D converter based on the first aspect, further comprises: input signal switching means for inputting either of said analog input voltage signal or a reference voltage in accordance with a selection signal; data storing means for storing said A/D conversion data when said reference signal is inputted to said input terminal through said input signal switching means; a dividing circuit for dividing said A/D conversion data when said analog input voltage signal is inputted to said input terminal through said input signal switching means by an output of said data storing means to output compensated A/D conversion data.

According to the present invention, a third aspect of the present invention provides an A/D converter based on the first aspect, wherein said control circuit comprises: a variable frequency oscillator for generating an oscillation signal of which frequency is controlled; and timing setting means for counting said oscillation signal and generating said first and second control signals in accordance with the counting result, said A/D converter further comprising: input signal switching means for inputting either of said analog input voltage signal, a first reference voltage, or a second reference voltage; first data storing means for storing said A/D conversion data when said first reference signal is inputted to said input terminal through said input signal switching means; second data storing means for storing said A/D conversion data when said second reference signal is inputted to said input terminal through said input signal switching means; oscillation frequency control means for obtaining a difference between outputs of said first and second storing means and controlling said frequency of said variable frequency oscillator to make said difference equal to a predetermined value; and deviation calculation means for calculating a deviation of said A/D conversion data when said analog input voltage signal is inputted to said input terminal through said input signal switching means from one of outputs of said first and second data storing means and outputting said calculated deviation as a compensated A/D conversion data.

According to the present invention, a fourth aspect of the present invention provides an A/D converter based on the first to third aspects, further comprises: signal selection means for inputting a plurality of input signals and supplying one of said input signals to said input terminal as said analog input voltage signal.

According to the present invention, a fifth aspect of the present invention provides an A/D converter comprising: a pulse circulating circuit for repeatedly generating a pulse, said pulse circulating circuit including a plurality of inverting circuits connected in series in a ring to circulate said pulse, one of inverting circuits having a control input to control generation of said pulse, each inverting circuit successively shifting an edge of said pulse to the next one of said inverting circuits with delay which varies in accordance with a supply voltage thereto; voltage signal generation means for generating a voltage signal as said supply voltage in accordance with a resolution control signal; a counter for counting said pulse and outputting binary count data; a pulse position detection circuit for detecting a position of one of said inverting circuits outputting an edge of said pulse and encoding the position into a binary data; a first input terminal for inputting a start signal supplied to said control input to operate said pulse circulating circuit; a second input terminal for inputting a stop signal to said pulse position detection circuit to detect said position; an outputting circuit for outputting A/D conversion data including said binary count data as upper bits and said binary data as lower bits, said binary count data indicating a time interval between said start and stop signals, wherein each of said counter, said pulse position detection circuit, said control circuit, and said outputting except said pulse circulating circuit, is supplied with a constant supply voltage, and said resolution in said A/D conversion data is controlled in accordance with said resolution control signal.

BRIEF DESCRIPTION OF THE DRAWINGS

The object and features of the present invention will become more readily apparent from the following detailed description taken in conjunction with the accompanying drawings in which:

FIG. 2 is a block diagram of a control circuit shown in FIG. 1;

FIGS. 3A to 3D are timing charts of A/D conversion with respect to the pulse signals PA and PB from the control circuit;

FIGS. 4A to 4C are timing charts of a modified a/c conversion operation according to the first embodiment;

FIGS. 10A to 10F are time charts of the A/D converter according to the second embodiment;

FIG. 11 is a graphical drawing according to the third embodiment showing the dynamic range and the reference voltages for the minimum analog input voltage and the maximum analog input voltage, respectively;

The same or corresponding elements or parts are designated with like references throughout the drawings.

DETAILED DESCRIPTION OF THE INVENTION

[First Embodiment]

Figure 1:
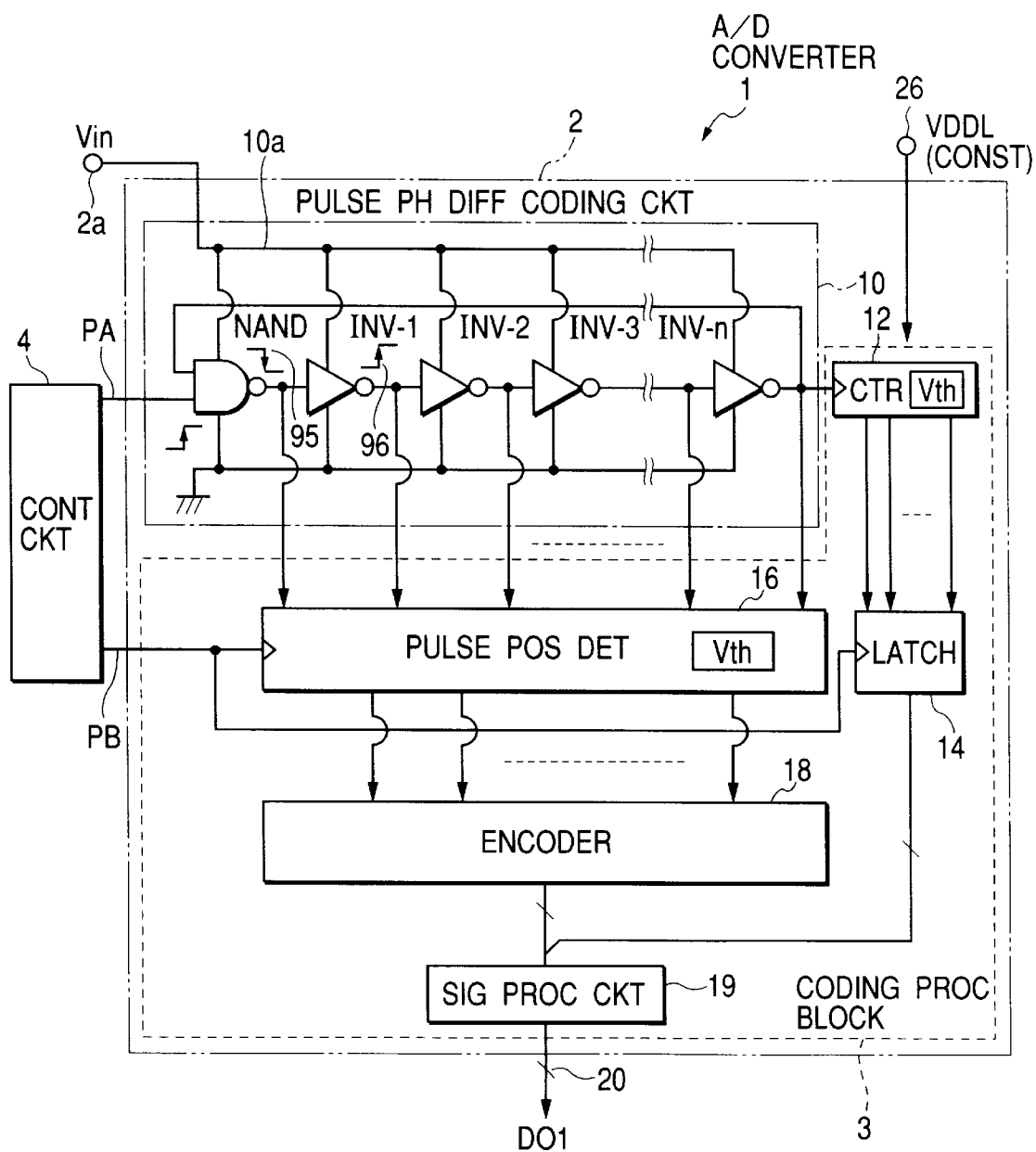
FIG. 1 is a block diagram of an A/D converter according to a first embodiment.

FIG. 1 shows a block diagram of an A/D converter according to a first embodiment. The A/D converter 1 according to the first embodiment includes a control circuit 4 for generating pulse signals PA and PB and a pulse phase difference coding circuit 2 for coding a phase difference between the pulse signals Pa and PB.

The pulse phase difference coding circuit 2 includes a ring gate delay circuit (pulse circulating circuit) 10 including a plurality of inverters including a NAND gate NAND and inverters INV connected in series in a ring, a counter 12 for counting pulses from an inverter INV-n just before the NAND gate in the ring, a latch 14 for latching data from the counter 12, a pulse position detector 16 for detecting an edge of pulse in the ring, and encoder 18 for encoding the position of the edge into binary data, and a signal processing circuit 19 for outputting A/D conversion data DO1 including the binary count data from the counter 14 as upper bits and said binary encoded data from the encoder 18 as lower bits.

The latch circuit 14 and the pulse position detector 16 operate in response to the pulse signal PB from the control circuit 4. The signal processing circuit 19 generates the A/D conversion data DO1 by subtracting the upper bits from the lower bits.

The inverting circuits in the ring gate delay circuit 10 are supplied with the analog input voltage signal Vin as a supply voltage thereto through a voltage supply line 10*a*. On the other hand, the coding processing block 3 including the counter 12, the latch 14, the pulse position detector 16, and the encoder 18, and the signal processing circuit 19 is supplied with a supply voltage VDDL of which voltage is constant. Here, the A/D converter including the ring gate delay circuit, the coding processing block, and control circuit, wherein the ring gate delay circuit and the coding processing block are supplied with the analog input voltage signal as the supply voltage, is disclosed U.S. Pat. Ser. No. 5,396,247, filed Mar. 15, 1993, entitled "ANALOG-TO-DIGITAL CONVERSION CIRCUIT HAVING A PULSE CIRCULATING PORTION", the disclosure of which is hereby incorporated by reference. In this A/D converter, the whole circuit in the pulse phase difference coding circuit was driven by the analog input voltage signal as mentioned earlier.

Referring now to FIG. 1, the ring gate delay circuit 10 starts circulation of a pulse in response to transition of the pulse signal PA to H and continues to circulate the pulse while the pulse signal PA is H. More specifically, the NAND gate NAND generates the pulse in response to the pulse signal PA. Then, the second inverting circuit, i.e., the inverter INV-1 inverts its output level as an edge 96 in response to the edge 95 of the pulse from the NAND gate with a delay. That is, each of inverting circuits successively shifts the pulse. The number of the inverting circuits is odd. The counter 12 counts the number of times of circulation. The latch 14 latches the count in the counter 12 when the pulse signal PB becomes H.

On the other hand, the pulse position detector 16 detects the edge of the pulse in the ring gate delay circuit 10 in response to the pulse signal PB. For example, an AND gate wherein its first input is connected to the input of the inverting circuit and its second input is connected to the output of the same inverting circuit can detect the edge 96. The encoder 18 generates digital data corresponding to the position of the edge of the pulse signal in the ring gate delay circuit 10.

The signal processing circuit 19 generates binary data DO1 as A/D conversion data from the encoded data from the encoder 18 and the digital data latched in the latch 14. Then, the signal processing circuit 19 supplies the binary data DO1 converted with respect to an interval Tc from the rising edge of the pulse signal PA to the rising edge of the pulse signal PB to the external through the data output line 20.

A power supply line 10*a* for supplying the power to the inverting circuits (inverters and the NAND gate) in the ring gate delay circuit 10, is connected to the input 2*a* for receiving the analog input voltage signal Vin to be A/D-converted. Thus, respective inverting circuits are supplied with the analog input voltage signal as the supply voltage through the supply voltage line 10*a*.

The interval necessary for inverting operation of each of the inverting circuits varies with the voltage of the supply voltage thereto. Accordingly, the digital data DO1 outputted form the data output line 20 varies with the voltage level of the analog input voltage signal Vin. Then, if the interval Tc is constant, the digital data represents the analog input voltage signal Vin.

FIG. 2 shows the structure of the control circuit 4. The control circuit 4 includes an oscillator 22 for generating an oscillation signal CK, a counter 24 for counting the oscillation signal, and a decoder 26 for generating the pulse signal PA and PB on the basis of the counting result of the counter 24.

FIGS. 3A to 3D show timing charts of A/D conversion with respect to the pulse signals PA and PB. The A/D conversion operation is started in response to the rising edge of the pulse signal PA cyclically. After the predetermined interval Tc, the pulse position detector 16, the latch 14, and the signal processing circuit 19 outputs the binary data DO1 in response to the pulse signal PB repeatedly.

Accordingly, the A/D converter 1 outputs the a/c conversion data DO1 corresponding to the voltage of the analog input voltage signal Vin. Moreover, the A/D conversion operation is periodically executed at a period corresponding to the output period of the pulse signals PA and PB. So, the value of the A/D conversion data DO1 varies as D0, D1, D2, - - - , in accordance with the voltage variation of the input analog input voltage signal Vin.

In this structure, increase in the interval Tc from the rising edge of the pulse signal PA and the rising edge of the pulse signal PB increases the resolution in the A/D conversion data DO1. More specifically, twice the interval Tc halves the voltage per one bit of the A/D conversion data. That is, the resolution of the A/D converter 1 can be set arbitrarily, so that a high resolution can be easily provided. Moreover, this A/D converter 1 has no special analog circuit, which reduces its circuit size.

FIGS. 4A to 4C show timing charts of a modified a/c conversion operation. In this case, the pulse signal PA only indicates the successive start of A/D conversion. On the other hand, the pulse signal PB indicates each end timings of A/D conversion. This provides the A/D conversion data at intervals TC1, TC2, TC3 - - - . Thus, the A/D conversion data at each A/D conversion interval can be obtained by subtraction of the result at previous A/D conversion interval from the result at the present A/D conversion interval.

As mentioned above, the inverting circuits in the ring gate delay circuit 10 are supplied with the analog input voltage signal Vin as a supply voltage through the voltage supply line 10*a*. On the other hand, the circuit 12 including the counter 12, the latch 14, the pulse position detector 16, and the encoder 18, and the signal processing circuit 19 are supplied with the supply voltage VDDL of which voltage is constant. Here, the supply voltage VDDL is determined to discriminate between the L and H levels in the predetermined dynamic range of the A/D converter 1. More specifically, if the voltage of the analog input voltage signal varies, the L and H levels of the output of the ring gate delay circuit 10 vary also. Then, if it is assumed that the upper limit of the L level of the output signal of the ring gate delay circuit 10 is $L_{up}$ and the lower limit of the H level of the output signal of the ring gate delay circuit 10 is $H_{low}$ ($L_{up} < H_{low}$), threshold level $V_{th}$ for discriminating the output voltage level at the inputs of the counter 12, and the pulse position detector 16 is set to the middle level between the $L_{up}$ and $H_{low}$, that is, $V_{th} \approx (L_{up} + H_{low})/2$.

In the A/D converter 1 having the above-mentioned structure, the operation characteristic of the coding processing block 3 does not vary though the voltage of the analog input voltage signal Vin varies. Moreover, if the voltage of the analog input voltage signal Vin varies within the above-mentioned dynamic range, the levels of output signals from the ring gate delay circuit 10 can be correctly discriminated.

This eliminates the non-linearity in A/D conversion result due to the unfavorable operation characteristic caused by supplying the analog input voltage signal Vin to the circuits other than the inverting circuits in the ring gate delay circuit 10 as the supply voltage.

As the result, if the allowable error is fixed, the A/D converter 1 according to this embodiment provides a wider input dynamic range. If the input dynamic range is fixed, this A/D converter 1 provides a more accurate A/D conversion result.

Figure 5:
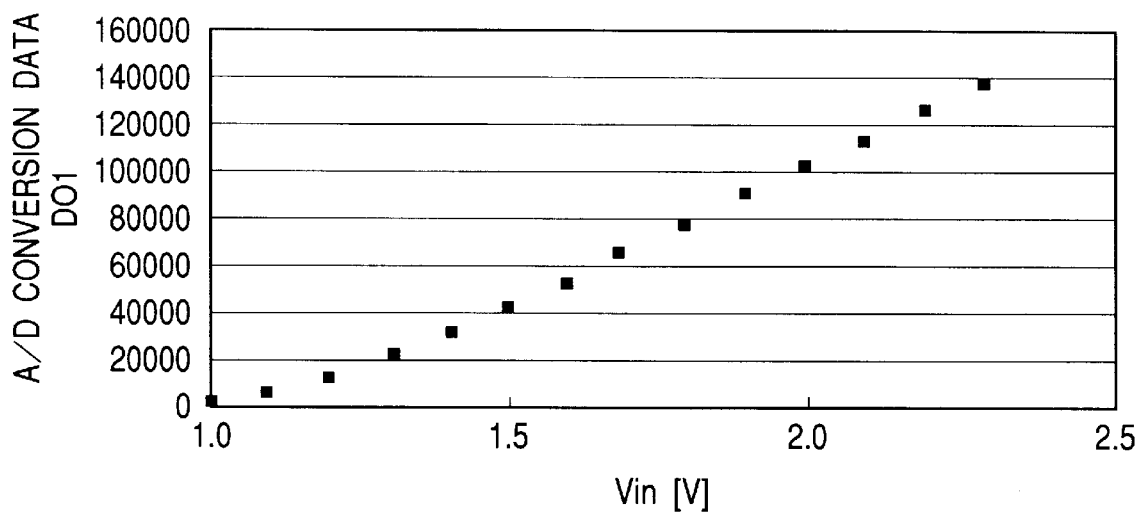
FIG. 5 is a graphical drawing showing a measurement result and showing the relation between the voltage of the analog input voltage signal Vin and the A/D conversion data according to the first embodiment.
Figure 16:
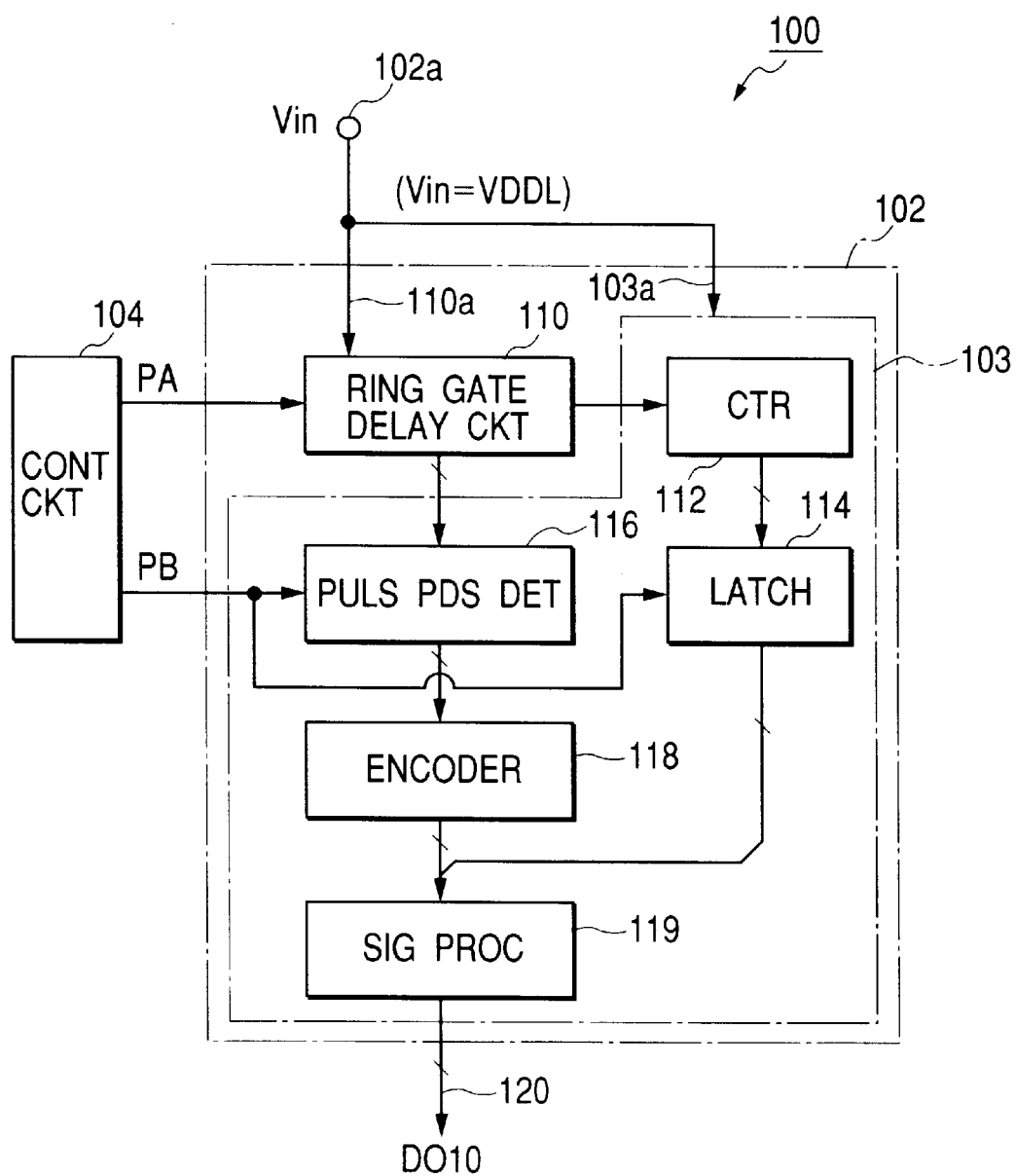
FIG. 16 is a block diagram of a prior art A/D converter.
Figure 17:
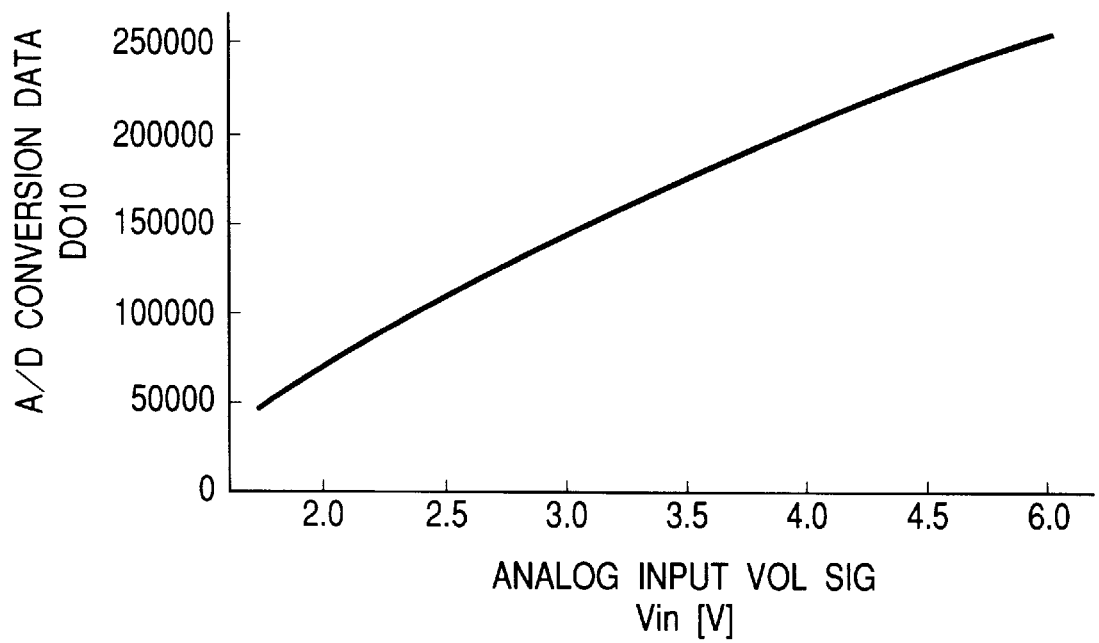
FIG. 17 is a graphical drawing showing the linearity according to the prior art A/D converter shown in FIG. 16.

FIG. 5 is a graphical drawing showing a measurement result and showing the relation between the voltage of the analog input voltage signal Vin and the A/D conversion result, that is, the A/D conversion data DO1. The inventor calculates the linearity error NL with assumption that the dynamic range of the analog input voltage signal Vin is from 1.4 V to 2.2 V. Then, the linearity error NL becomes about 0.26%, which is considerably improved from the prior art A/D converter shown in FIG. 16 which shows the linearity error NL≈10% if the dynamic range is from 2.0 V to 2.2 V.

Figure 6:
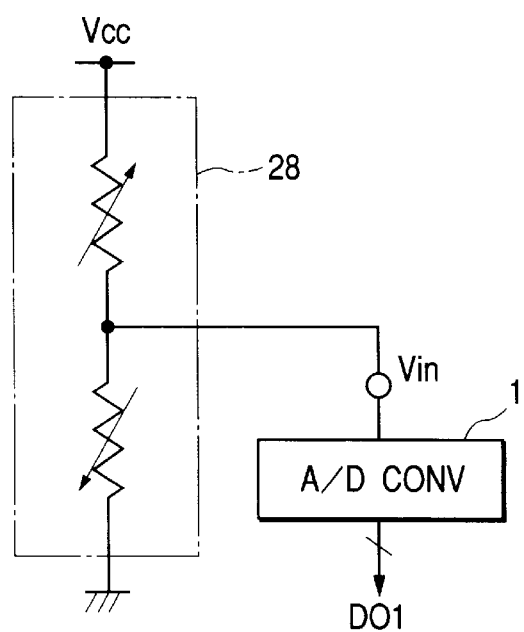
FIG. 6 is a schematic circuit diagram showing an example of a signal detection circuit using the A/D converter according to the first embodiment.

Moreover, because the A/D converter 1 according to the first embodiment can convert the analog input voltage Vin into the digital data without any special analog circuit, it can provide accurate A/D conversion although the ambient temperature is high. Therefore, as shown in FIG. 6, if this A/D converter 1 is used in a signal detection circuit including a sensing element 28, the useable condition of the sensing element 28 can be expanded. In FIG. 6, the sensing element 28 has a bridge structure supplied with a supply voltage Vcc, and its output voltage varies with a physical amount (pressure, acceleration, magnetic field, or the like). The A/D converter 1 is supplied with the output of the bridge structure as the analog input voltage signal Vin to provide the A/D conversion data DO1 which corresponds to the voltage of the output of the bridge.

In the case that this A/D converter 1 is used in the signal detection circuit in this way, if the impedance of the sensing element 28 is so large that the A/D converter 1 incorrectly operates, it is sufficient to add a general impedance conversion circuit such as a voltage follower circuit, a source follower circuit, or the like between the sensing element 28 and the A/D converter 1.

Moreover, if a Hall element is used as the sensing element 28 instead the bridge circuit, the Hall voltage is supplied to the A/D converter as the analog input voltage signal Vin.

Figure 7:
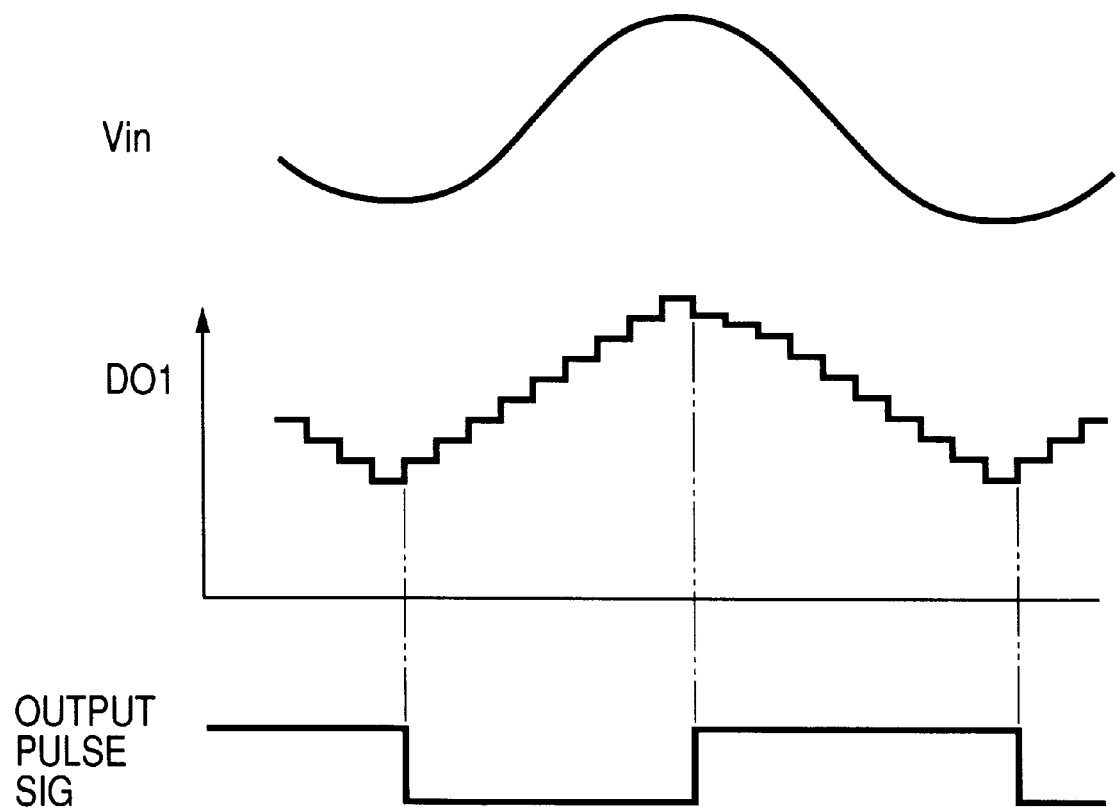
FIG. 7 is a graphical drawing of the A/D conversion operation according to the fist embodiment when the A/D converter according to the first embodiment is used in another signal detection circuit.

Moreover, because the A/D conversion data DO1 outputted by the A/D converter 1 varies with the voltage of the analog input voltage signal Vin as shown in FIG. 7, a logic circuit for outputting H level when the A/D conversion data DO1 increases and outputs L level when the A/D conversion data DO1 decreases to provide an output pulse signal varying in phase with the detection signal, may be provided as an addition output circuit.

Figure 8:
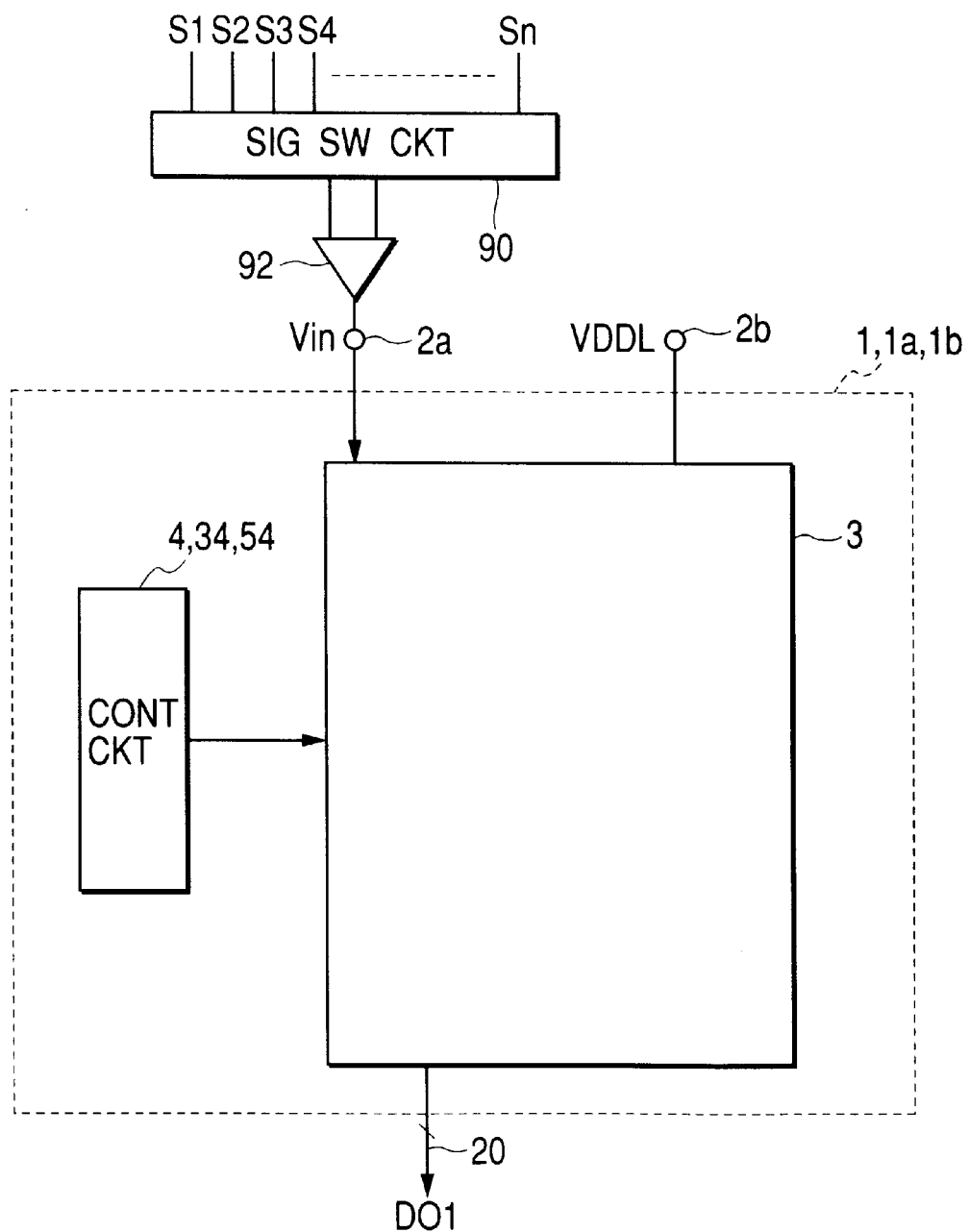
FIG. 8 a block diagram of an A/D conversion system including a signal switching circuit 90, a buffer amplifier 92, and the A/D converter according to the first, second, or third embodiment.

FIG. 8 is a block diagram of an A/D conversion system including a signal switching circuit 90, a buffer amplifier 92 and the A/D converter 1, 1a, or 1b. In this system, the signal switching circuit 90 successively inputs, that is, switchably inputs, one of the signals S1 to Sn to supply it to the A/D converter 1 through the buffer amplifier 92 and the input terminal 2a to successive A/D conversion.

In this structure, because the coding processing block 3 operates without affection of the analog input voltage signal Vin, although the analog input voltage signal Vin rapidly changes due to operation of the signal switching circuit 90, this structure provides a stable A/D conversion result. For example, this A/D converter 1 can be used to convert the output signals from respective pixels in an image sensor.

This A/D converter 1 according to the first embodiment provides accurate A/D conversion even at a high temperature because A/D conversion is effected utilizing variation in the inverting operation intervals of the inverting circuits in the ring gate delay circuit 10. However, the inverting operation intervals still vary with the temperature. Variation in the inverting operation intervals affects the A/D conversion result.

An A/D converter with the A/D conversion data compensated against the temperature variation will be described in the second embodiment.

[Second Embodiment]

Figure 9:
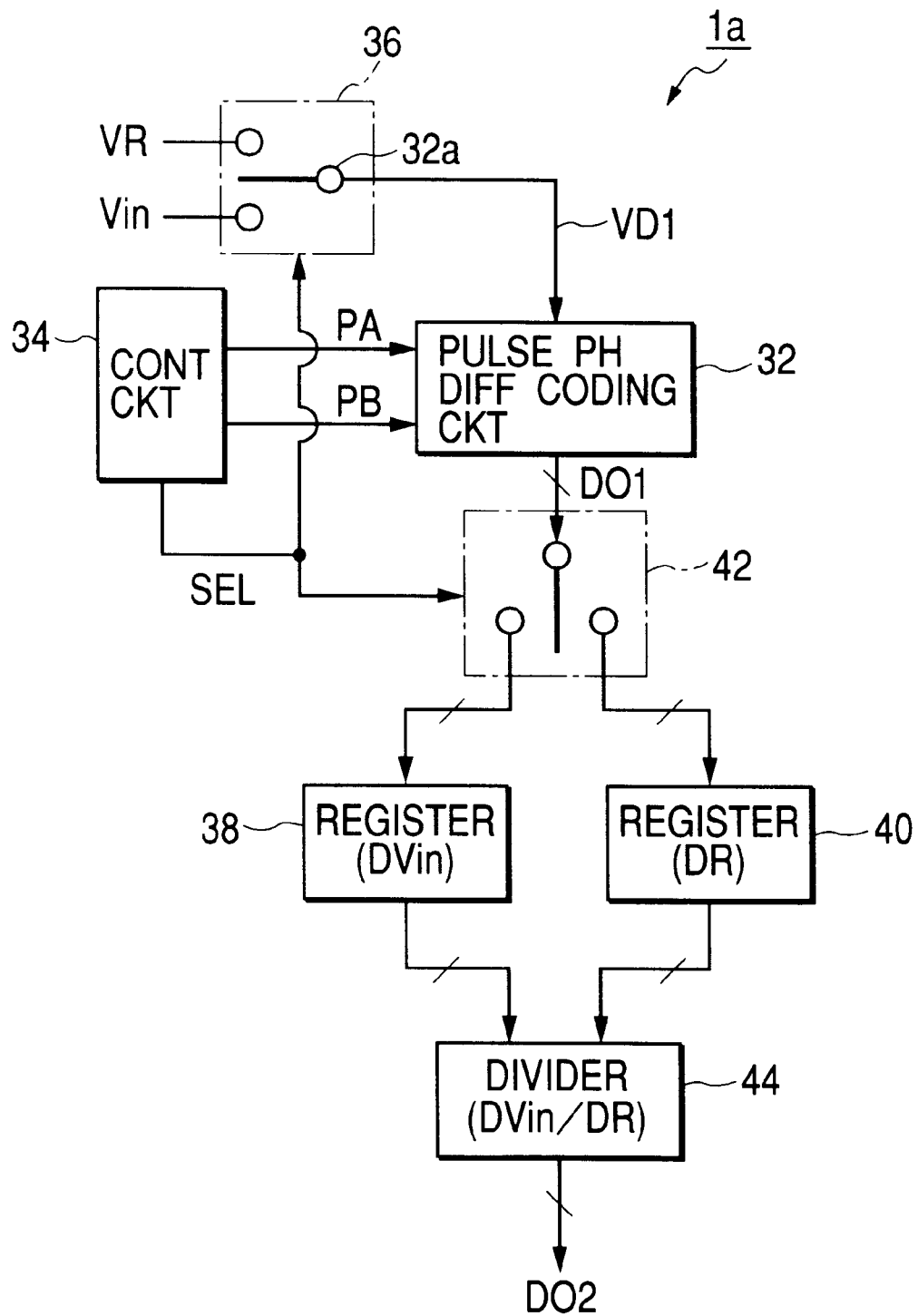
FIG. 9 is a block diagram of an A/D converter according to a second embodiment of the present invention.

FIG. 9 is a block diagram of an A/D converter 1a according to a second embodiment of the present invention. The A/D converter 1a according to the second embodiment includes a pulse phase difference coding circuit 32, a control circuit 34, a switch 36, registers 38 and 40, a switch 42, and a divider 44.

The pulse phase difference coding circuit 32 has the same structure as the pulse phase difference coding circuit 2 according to the first embodiment. The control circuit 34 has the same structure as the control circuit 4 in the first embodiment, for generating the pulse signals PA and PB and further generating a selection signal SEL which is inverted at a given timing after the rising edge of the pulse signal PB. The switch 36 inputs either of the analog input voltage signal Vin or a reference voltage Vr in response to the selection signal SEL.

The register 38 stores the A/D conversion data DVin of the analog input voltage Vi from the pulse phase difference coding circuit 32 through the switch 42. The register 40 stores the A/D conversion data DR of the reference voltage VR from the pulse phase difference coding circuit 32 through the switch 42. The switch 42 supplies the A/D conversion data DO1 to either of the resistor 38 as A/D conversion data DVin or the register 40 as A/D conversion data DR in accordance with the selection signal SEL. The divider 44 divides the A/D conversion data DVin by the A/D conversion data DR to compensate the A/D conversion data DVin to output the compensated A/D conversion data DO2.

Moreover, the control circuit 34, the switch 36, the registers 38 and 40, the switch 42, and the divider 44 except the pulse phase difference coding circuit 32 are driven by the constant supply voltage which may be the same as or different from the supply voltage VDDL to the coding process block 3. Therefore, the A/D conversion operation is accurate.

FIGS. 10A to 10F are time charts of the A/D converter 1a according to the second embodiment. The switch 36 alternately outputs the analog input voltage signal Vin and the reference voltage RV at its output VD1 in response to the selection signal SEL. Then, the pulse phase difference coding circuit 32 alternately outputs the A/D conversion data DVin and DR corresponding to the analog input voltage signal Vin and the reference voltage VR.

The A/D conversion data DVin from the pulse phase difference coding circuit 32 is stored in the register 38, and the A/D conversion data DR is stored in the register 40.

The divider 44 divides the A/D conversion data Vin by the A/D conversion data DR to output compensated A/D conversion data DO2.

As mentioned above, in the A/D converter 1a, although the inverting operation intervals of the inverting circuits (NAND and INVs) vary in accordance with the temperature and thus, the A/D conversion data DVin indicative of the analog input voltage signal Vin varies, the A/D conversion data DR indicative of the reference voltage DR also varies similarly, so that the variation in the A/D conversion data DVin is cancelled by the variation in the A/D conversion data DR by dividing.

The reference voltage DR is generated by a voltage divider (not shown) for example. The voltage divider is connected in parallel to a detection circuit (not shown) generating the analog input voltage signal with respect to the supply voltage supplied to this detection circuit. The detection circuit may be a sensing resistor circuit including first and second sensing resistors connected in series, wherein the analog input voltage signal is outputted at the junction point of these first and second sensing resistors. Moreover, the voltage divider is located near the detection circuit to equalize their temperatures. The voltage of the reference voltage DR is determined by the ratio of the resistances of the resistors included therein in accordance with the required voltage. As a result, the reference voltage DR varies with analog input voltage, so that the A/C conversion data is compensated.

The A/D converter $1a$ outputs the A/D conversion data compensated in accordance with the temperature using the divider as mentioned above. Next, a self compensation type of A/D converter using PLL will be described in the third embodiment.

[Third Embodiment]

Figure 12:
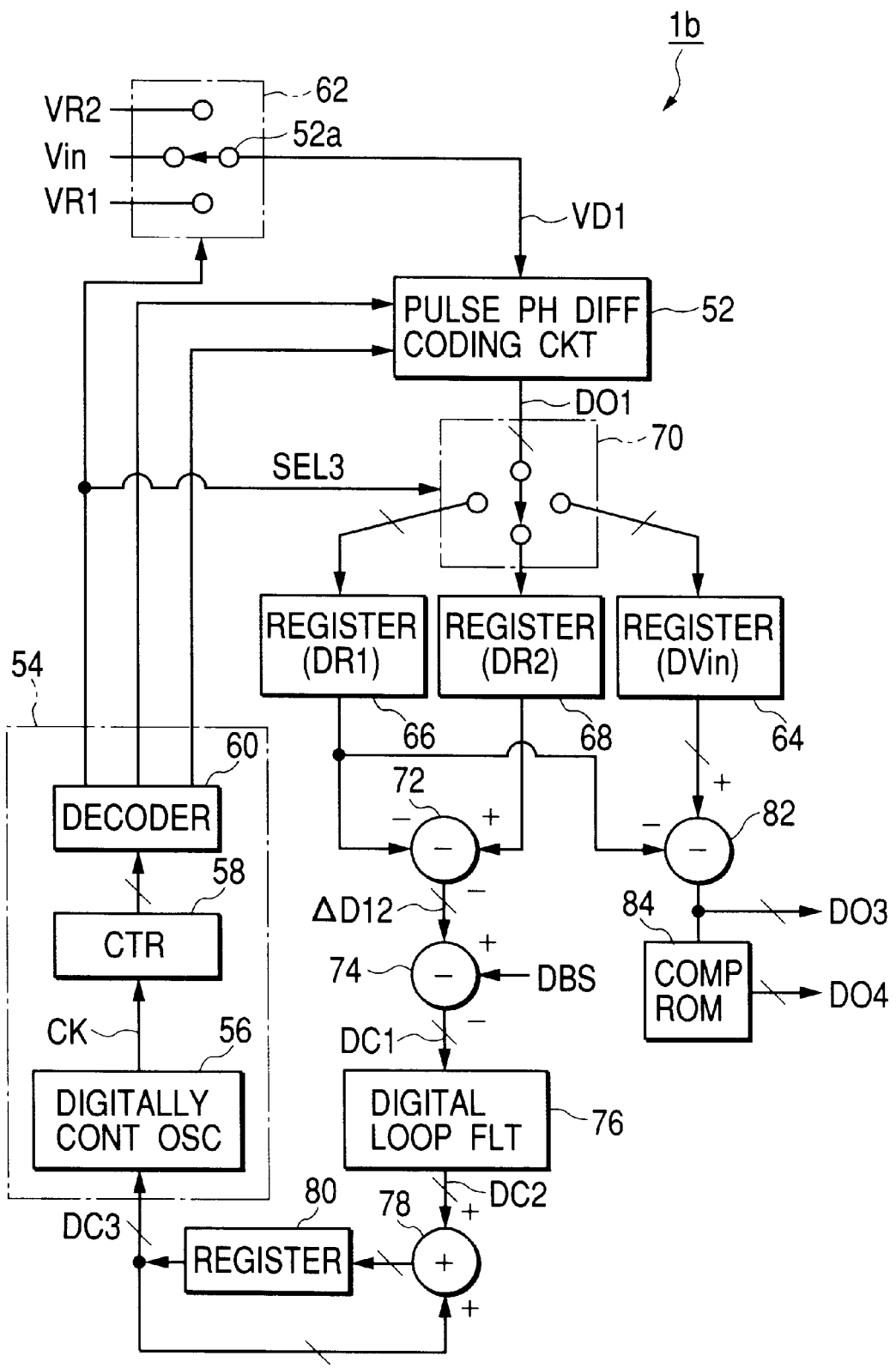
FIG. 12 is a block diagram of an A/D converter according to a third embodiment.
Figure 13:
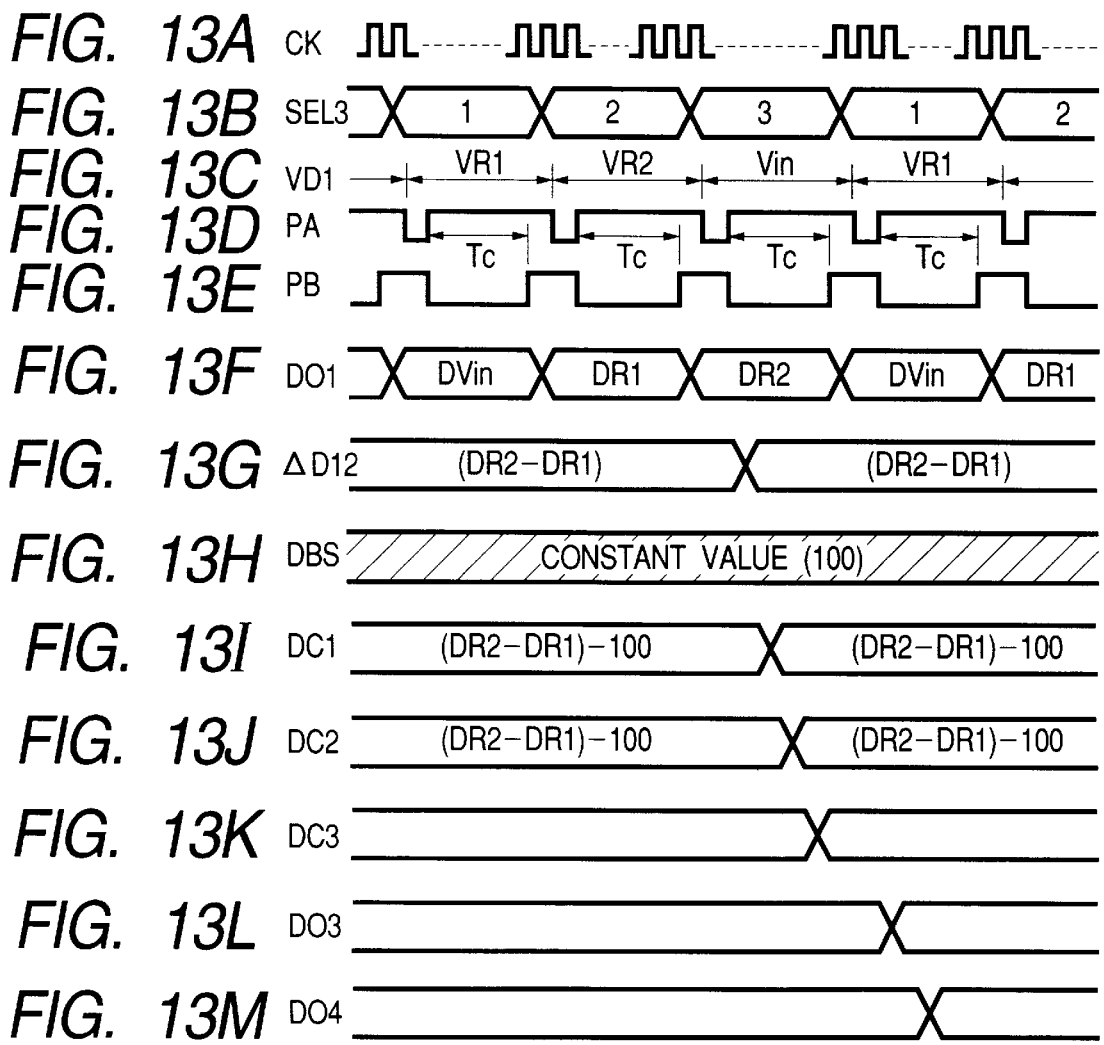
FIGS. 13A to 13M are time charts according to the third embodiment.

FIG. 11 is a graphical drawing according to a third embodiment showing the dynamic range and the reference voltages VR1 and VR2 for the minimum analog input voltage Vin and the maximum analog input voltage Vin, respectively. FIG. 12 is a block diagram of an A/D converter $1b$ according to the third embodiment.

The A/D converter $1b$ uses the reference voltage VR1 and VR2 to compensate the A/D conversion result. More specifically, the interval Tc from the rising edge of the pulse signals PA and PB is controlled with a PLL for compensation so as to make the difference between the A/D conversion result DR1 indicative of the minimum analog input voltage VR1 and the maximum analog input voltage VR2 constant, for example, 1100–1000×100 although the temperature varies.

For example, if it is assumed that VR1 4.5 V, VR2=5.5 V, the voltage per one bit (LSB), that is, the voltage resolution is given by:

$$LSB = (VR2 - VR1)/(DR2 - DR4)$$
$$= 1000 \text{ mV}/100 = 10 \text{ mV}.$$

Here, if it is assumed that the difference between the minimum voltage VR1 and the analog input voltage signal Vin is VS, and that the A/D conversion data DO1 linearly varies from the minimum voltage signal lVR1 to the maximum voltage signal VR2, the difference voltage VS between the analog input voltage signal Vin and the minimum voltage signal VR1 is given by:

$$VS=LSB\cdot(DVin-DR1)$$

The analog input voltage signal Vin is given by:

$$Vin=VR1+LSB\cdot(DVin-DR1)$$

FIG. 12 shows such a structure of an A/D converter $1b$ according to the third embodiment. FIGS. 13A to 13M are time charts according to the third embodiment.

The A/D converter $1b$ includes a switch 62 for inputting either of the minimum voltage VR1, the analog input voltage signal Vin, or the maximum voltage VR2, the pulse phase difference coding circuit 52 having the same structure as that of the first embodiment, a control circuit 54 having a similar circuit structure to that of the first embodiment, registers 64, 66, and 68, a switch 70 for outputting the A/D conversion result to either of register 66, 68, or 68, subtractors 72, 74, and 82, a digital loop filter 76, an adder 78, a register 80, and a compensation ROM 84.

The control circuit 54 includes a digitally controlled oscillator 56 of which oscillation frequency can be controlled with digital data DC3, a counter 58 for counting the oscillation signal CK from the digitally controlled oscillator 56, and a decoder 60 for generating the pulse signals PA and PB on the basis of the counting result of the counter 58 and at a given timing after the rising edge of the pulse signal PB, generating a selection signal SEL3 indicative of three states. The oscillation frequency of the digitally controlled oscillator 56 is controlled with the data DC3 from the register 80 to control the interval Tc between the pulse signals PA and PB.

The switch 62 successively supplies either of the minimum voltage VR1, the analog input voltage signal Vin, or the maximum voltage VR2 in response to the selection signal SEL3 to the input terminal $52a$ of the pulse phase difference coding circuit 52.

The switch 70 successively supplies the output of the pulse phase difference coding circuit 52 to either of the register 66, the register 68, or the register 64 in response to the selection signal SEL3.

To control the interval Tc to maintain the difference between the A/D conversion data DR2 corresponding to the maximum voltage signal VR2 and the A/D conversion data DR1 corresponding to the minimum voltage signal VR1 at a constant value DB, the following processing is executed.

The subtractor 72 subtracts the digital data DR1 stored in the resistor 66 from the digital data DR2 to provide the difference $\Delta DR12$ (=DR2−DR1). The subtracter 74 obtains the difference DC1 (=DBS−$\Delta D12$) between the difference $\Delta DR12$ and the reference data DBS determining the interval Tc between the rising edges of the pulse signals PA and PB.

The result DC1 of the subtracter 74 is supplied to the digital loop filter 76. The digital loop filter 76 removes high frequency noise to output data DC2. The adder 78 adds the data DC2 to control data DC3 determining the oscillation frequency of the digitally controlled oscillator 56. The addition result is stored in the register 80 to compensate the control data DC3.

As the result, if the difference DC1 between the $\Delta D12$ and the reference data DBS is positive, the positive data DC2 is added to the present control data DC3, so that the control data DC3 inputted to the digital controlled oscillator 56 increases. This increases the oscillation frequency of the digital controlled oscillator 56, so that the interval Tc between the rising edge of the pulse signals PA and PB is shortened. On the other hand, if the difference DC1 between the $\Delta DR12$ and the reference data DBS is negative, the negative data DC2 is added to the present control data DC3, so that the control data DC3 inputted to the digital controlled oscillator 56 decreases. This decreases the oscillator frequency of the digital controlled oscillator 56, so that the interval Tc between the pulse signal PA and PB increases.

Moreover, the subtracter 82 subtracts the digital data DR1 corresponding to the minimum voltage signal VR1 stored in the register 66 from the digital data DVin corresponding to the voltage signal Vin stored in the register 64, that is, calculates the difference DO3 (=DVin−DR1). Further the compensation ROM 84 compensates the calculation result DO3 to output the compensated digital data DO4.

Figure 14:
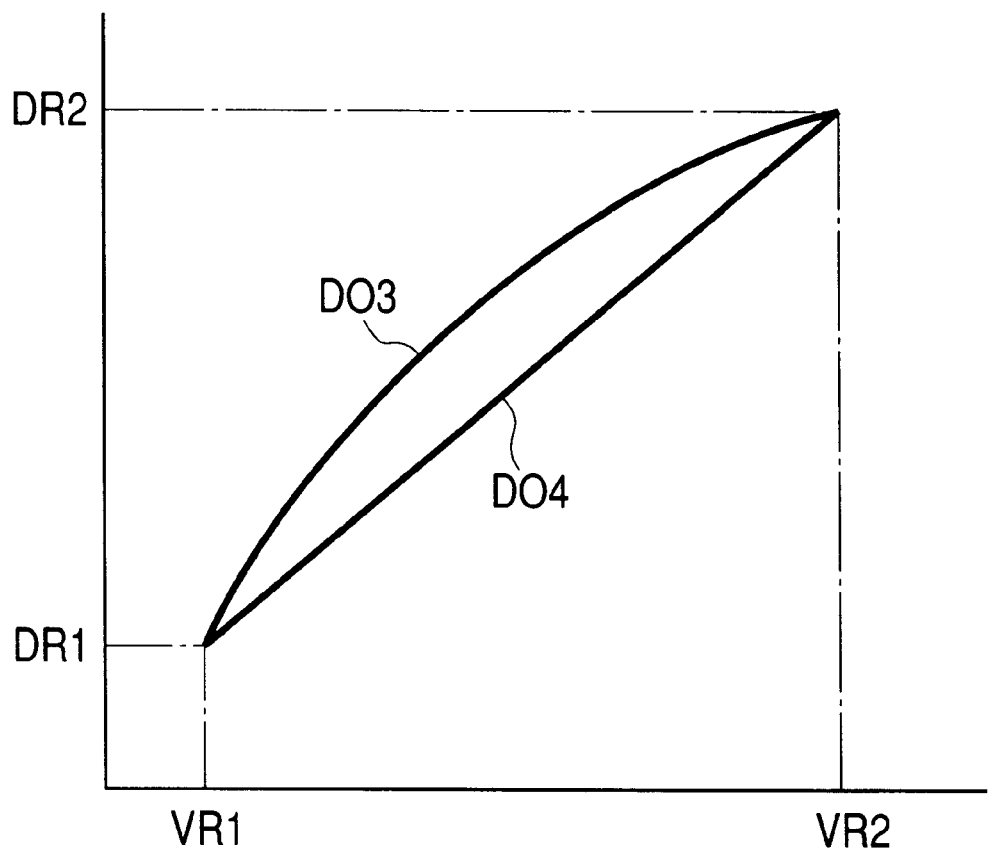
FIG. 14 is a graphical drawing showing a compensation operation according to the third embodiment.

That is, the subtracter 82 obtains the digital data DO3 corresponding to the voltage signal Vin from the reference of the minimum voltage signal VR1 by subtracting DR1 from DVin. The calculation result DO3 does not linearly varies with the variation of the voltage signal Vin as shown in FIG. 14. Then, in this embodiment, the compensation values corresponding to this characteristic are stored in the compensation ROM 84. The compensation ROM 84 compensates the digital data DO3 with these compensation values to output the digital data DO4 which linearly varies with the variation of the voltage signal Vin.

Here, the reason why the digital data DO3 lineally varies with the variation of the voltage signal Vin is that the delay intervals of the inverting circuits such as the NAND gate and inverters INV forming the ring gate delay circuit 10 does not linearly varies with the variation of the supply voltage thereto.

In addition, as similar to the second embodiment, respective circuits other than the pulse phase difference coding circuit 52 are driven with constant supply voltage which may be the same as or different from the supply voltage VDDL for the coding process block 3.

As mentioned above, in the A/D converter 1b according to this embodiment, the digital PLL is formed with the subtractors 72 and 74, the digital loop filter 76, the adder 78, the register 80, and the digitally controlled oscillator 56 to control the interval Tc between the rising edges of the pulse signals PA and PB so as to make the difference ΔD12 between the digital data DR1 and DR2 equal to the reference data DBS which is constant and equal to 100.

This structure provides the digital data DO3 which always corresponds to the analog input voltage signal Vin though the inverting operation intervals of the inverting circuits in the pulse phase difference coding circuit 52 vary with the temperature or the like. Moreover, this embodiment provides the compensation ROM 84 for compensating the digital data DO3, so that the digital data DO4 which linearly varies with the analog input voltage signal Vin.

Moreover, in this embodiment, the compensation ROM 84 is used for obtaining the digital data DO4 which linearly varies with the variation of the analog input voltage signal Vin. However, it is also possible to use the compensation ROM 84 for providing a given characteristic of the digital data DO4 such as a sine curve or the like by changing the compensation values stored in the compensation ROM 84.

Moreover, the digitally controlled oscillator 56 is used as the oscillator in the control circuit 54, so that the digital data from the register 80 can be used to control the oscillation frequency of the oscillator as it is, which simplifies the circuit structure.

More specifically, to form a PLL, it is possible to use an analog voltage controlled oscillator (VCO) as the oscillator too. However, such a structure further requires a D/C converter and does not allow the control data DC3 to be directly supplied to the oscillator 56.

As a digitally controlled oscillator, there were oscillators in which a fixed oscillation signal from a quartz crystal oscillating element is divided. Such an oscillator obtains the desired oscillation frequency by frequency dividing the clock signal, so that the resultant clock frequency becomes relative low, that is, lower than 100 kHz. So, it is desired to use a digital controlled oscillator 56. The digitally controlled oscillator 56 may be of a type shown in U.S. patent application Ser. No. 956,955, filed on Oct. 2, 1992, entitled "VARIABLE-FREQUENCY OSCILLATION CIRCUIT AND A DIGITALLY CONTROLLED OSCILLATOR", the discloser of which is hereby incorporated by reference. This digitally controlled oscillator uses the ring oscillator having the similar structure as the ring gate delay circuit 10 according to the present invention, so that it can control the oscillation frequency up to tens megahertz.

[Fourth Embodiment]

In the above-mentioned embodiments, the analog input voltage signal Vin is A/D-converted. On the other hand, the A/D converter according to the fourth embodiment A/D-converts the interval between inputs of the pulse signals PA and PB. In other words, the A/D converter measures this interval.

Figure 15:
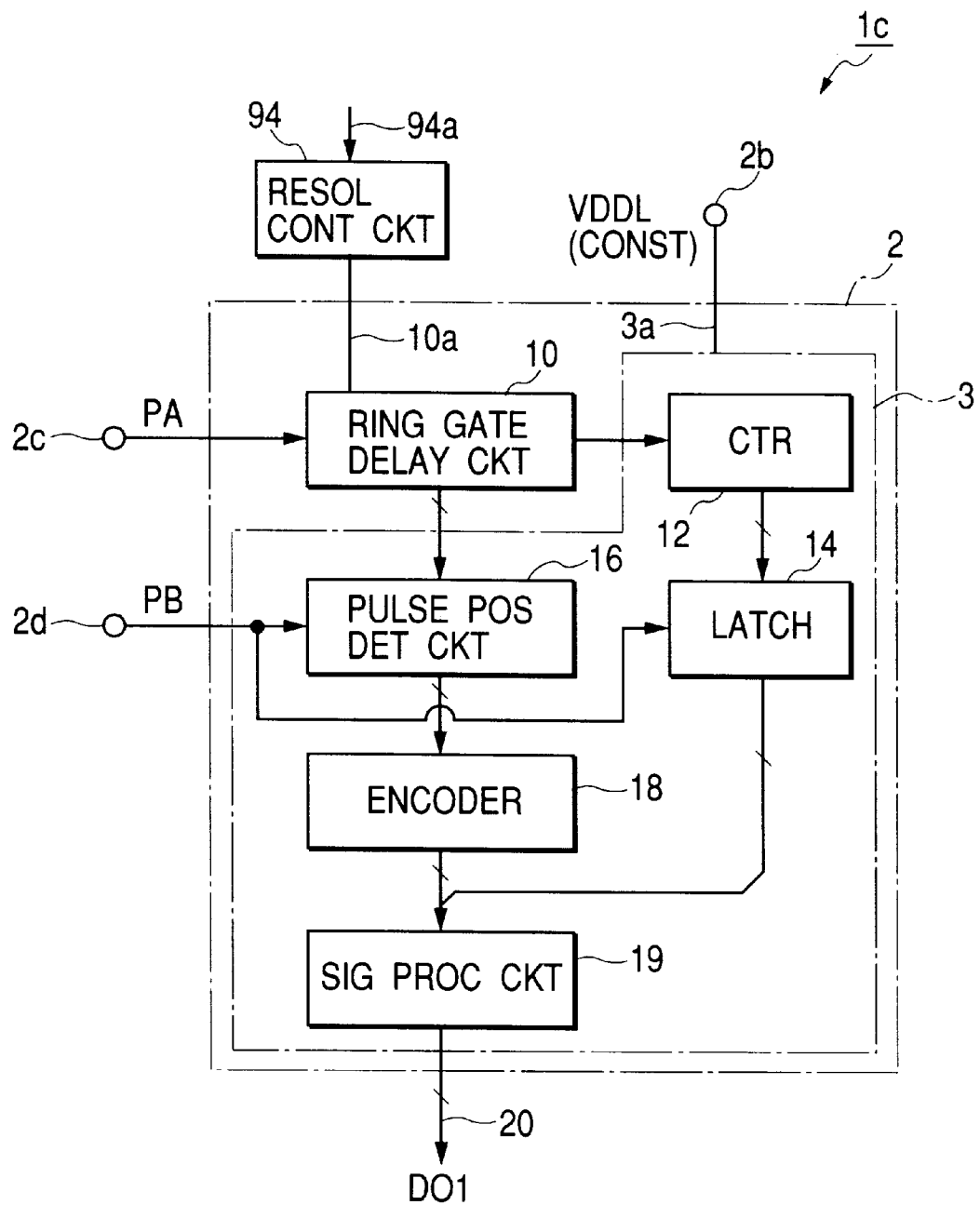
FIG. 15 is a block diagram of the A/D converter according to a fourth embodiment.

FIG. 15 is a block diagram of the A/D converter according to the fourth embodiment. The A/D converter according to the fourth embodiment has substantially the same structure as that of the first embodiment. The difference is that the control circuit 4 is omitted, but, on the other hand, input terminals 2c and 2d are provided to input the pulse signals PA and PB indicating start and end of the A/D conversion operation of the ring gate delay circuit 10, respectively. Moreover, a resolution control circuit 94 is further provided to supply the analog input voltage signal to the power supply line 10a to the inverting circuits in the ring gate delay circuit 10. The range of the analog input voltage signal from the resolution control circuit 94 is the same as the dynamic rage of the analog input voltage signal Vin in the first embodiment.

This A/D converter 1c provides an A/D conversion result varying in accordance with the time interval from when the pulse signal PA is inputted to when the pulse signal PB is inputted as the digital data DO1 at the data output line 20. Moreover, if the setting voltage in the resolution control circuit 94 is controlled in accordance with the resolution control signal 94a, the cycle of calculation of the pulse varies, so that the resolution of the A/D converter 1c varies.

Here, the coding process block 3 is not driven by the resolution control circuit 94, but driven by the different supply voltage VDDL which is constant. This provides an accurate measurement of the time interval between the pulse signals PA and PB because the resolution linearly varies with the analog voltage from the resolution control circuit 94.

The A/D converters 1a and 1b according to the second and third embodiments may be supplied with the analog input voltage signal Vin through the signal switching circuit 90 and the buffer amplifier 92 as shown in FIG. 8.

What is claimed is:

1. An A/D converter comprising:
    a pulse circulating circuit including a plurality of inverting circuits connected in series in a ring to generate and circulate a pulse for repeatedly outputting said pulse, one of said inverting circuits supplied with a first control signal to control generation of said pulse, each inverting circuit successively shifting an edge of said pulse to the next one of said inverting circuits with delay which varies in accordance with a supply voltage thereto;
    an input terminal for inputting and supplying an analog input voltage signal only to said inverting circuits as said supply voltage;
    a counter circuit for counting said pulse and in response to a second control signal and outputting binary count data;
    a pulse position detection circuit for detecting a position of one of said inverting circuits outputting an edge of said pulse and for, in response to a second control signal, encoding the position into binary encoded data;
    a control circuit for generating said first control signal to operate said pulse circulating circuit and after a predetermined interval from generation of said first control signal, generating said second control signal to detect said position; and an outputting circuit for outputting A/D conversion data including said binary count data as upper bits and said binary encoded data as lower bits, wherein each of said counter, said pulse position detection circuit, said control circuit, and said outputting circuit except said pulse circulating circuit, is supplied with a constant supply voltage.

2. The A/D converter as claimed in claim 1, further comprising:

input signal switching means for inputting either of said analog input voltage signal or a reference voltage in accordance with a selection signal;

data storing means for storing said A/D conversion data when said reference signal is inputted to said input terminal through said input signal switching means;

a dividing circuit for dividing said A/D conversion data when said analog input voltage signal is inputted to said input terminal through said input signal switching means by an output of said data storing means to output compensated A/D conversion data.

3. The A/D converter as claimed in claim 1, wherein said control circuit comprises:

a variable frequency oscillator for generating an oscillation signal of which frequency is controlled; and timing setting means for counting said oscillation signal and generating said first and second control signals in accordance with the counting result, said A/D converter further comprising:

input signal switching means for inputting either of said analog input voltage signal, a first reference voltage, or a second reference voltage;

first data storing means for storing said A/D conversion data when said first reference signal is inputted to said input terminal through said input signal switching means;

second data storing means for storing said A/D conversion data when said second reference signal is inputted to said input terminal through said input signal switching means;

oscillation frequency control means for obtaining a difference between outputs of said first and second storing means and controlling said frequency of said variable frequency oscillator to make said difference equal to a predetermined value; and deviation calculation means for calculating a deviation of said A/D conversion data when said analog input voltage signal is inputted to said input terminal through said input signal switching means from one of outputs of said first and second data storing means and outputting said calculated deviation as a compensated A/D conversion data.

4. The A/D converter as claimed in claim 1, further comprising:

signal selection means for inputting a plurality of input signals and supplying one of said input signals to said input terminal as said analog input voltage signal.

5. The A/D converter as claimed in claim 2, further comprising:

signal selection means for inputting a plurality of input signals and supplying one of said input signals to said input terminal as said analog input voltage signal.

6. The A/D converter as claimed in claim 3, further comprising:

signal selection means for inputting a plurality of input signals and supplying one of said input signals to said input terminal as said analog input voltage signal.

7. An A/D converter comprising:

a pulse circulating circuit for repeatedly generating a pulse, said pulse circulating circuit including a plurality of inverting circuits connected in series in a ring to circulate said pulse, one of inverting circuits having a control input to control generating said pulse, each inverting circuit successively shifting an edge of said pulse to the next one of said inverting circuits with delay which varies in accordance with a supply voltage thereto;

voltage signal generation means for generating a voltage signal as said supply voltage in accordance with a resolution control signal;

a counter for counting said pulse and outputting binary count data;

a pulse position detection circuit for detecting a position of one of said inverting circuits outputting an edge of said pulse and encoding the position into a binary data;

a first input terminal for inputting a start signal supplied to said control input to operate said pulse circulating circuit;

a second input terminal for inputting a stop signal to said pulse position detection circuit to detect said position;

an outputting circuit for outputting A/D conversion data including said binary count data as upper bits and said binary data as lower bits, said binary count data indicating a time interval between said start and stop signals, wherein each of said counter, said pulse position detection circuit, said control circuit, and said outputting except said pulse circulating circuit, is supplied with a constant supply voltage, and said resolution in said A/D conversion data is controlled in accordance with said resolution control signal.

* * * * *